United States Patent
Campbell et al.

(10) Patent No.: US 7,525,328 B2
(45) Date of Patent: *Apr. 28, 2009

(54) CAP AT RESISTORS OF ELECTRICAL TEST PROBE

(75) Inventors: Julie A. Campbell, Beaverton, OR (US); Lawrence W. Jacobs, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/890,095

(22) Filed: Aug. 3, 2007

(65) Prior Publication Data

US 2007/0273360 A1    Nov. 29, 2007

Related U.S. Application Data

(63) Continuation of application No. 11/018,134, filed on Dec. 17, 2004, now Pat. No. 7,295,020.

(60) Provisional application No. 60/531,077, filed on Dec. 18, 2003.

(51) Int. Cl.
*G01R 31/02*    (2006.01)

(52) U.S. Cl. .................. 324/754; 324/761; 324/762

(58) Field of Classification Search .............. None
See application file for complete search history.

(56) References Cited

U.S. PATENT DOCUMENTS

| | | | |
|---|---|---|---|
| 2,488,328 A | 11/1949 | Francis | |
| 3,256,484 A | 6/1966 | Terry | |
| 5,045,781 A | 9/1991 | Gleason et al. | |
| 5,067,965 A | 11/1991 | Ersek et al. | |
| 6,275,054 B1 | 8/2001 | Boyle | |
| 6,538,524 B1 | 3/2003 | Miller | |
| 6,632,534 B2 | 10/2003 | Skaling et al. | |
| 6,664,914 B2 | 12/2003 | Longstaff et al. | |
| 7,012,482 B2 | 3/2006 | Rawnick et al. | |
| 7,295,020 B2 * | 11/2007 | Campbell et al. | ........... 324/754 |

OTHER PUBLICATIONS

LeCroy WaveLink D600, D300, D200, High Bandwidth Probes Probing Solutions, 2003, 4 pages, http://www.lecoln.com.tw/getfile/lecroy/Datasheet/WaveLink/WaveLink_DS.pdf.
LeCroy Announces WaveLink Probe Family for Test of PCI Express, Serial ATA and other High Bandwidth Applications, 2003, 4 pages, http://www.lecroy.com/ProductPress/FY03/021903.asp.

* cited by examiner

*Primary Examiner*—Minh N Tang
(74) *Attorney, Agent, or Firm*—Law Office of Karen Dana Oster, LLC

(57) ABSTRACT

A lossy dielectric device dissipates, absorbs, and/or dampens electric fields. The lossy dielectric device may be used with any transmission path, such as a transmission line or resistor in a probe head. The lossy dielectric device preferably includes a lossy dielectric material contained within a container. The container is positionable and securable substantially adjacent the transmission path to improve the curve of a frequency response. Preferably, the container is insulative, puncture resistant, and thin. In some preferred embodiments, a temporary or permanent connection mechanism is also included.

22 Claims, 9 Drawing Sheets

CAP AT RESISTORS OF ELECTRICAL TEST PROBE

The present application is a continuation of U.S. patent application Ser. No. 11/018,134, filed Dec. 17, 2004, now U.S. Pat. No. 7,295,020. U.S. patent application Ser. No. 11/018,134 is an application claiming the benefit under 35 USC Section 119(e) of U.S. Provisional Patent Application Ser. No. 60/531,077, filed Dec. 18, 2003. The present application is based on and claims priority from these applications, the disclosures of which are hereby expressly incorporated herein by reference.

BACKGROUND OF INVENTION

The present invention is directed to a lossy dielectric cap that dissipates electric fields that may be used near current transmission or conduction paths in a probing head of an electrical test probe.

FIG. 1 shows a probing system that includes an electrical test probe 20 for providing an electrical connection between electrical components 22 and testing instruments 24. An electrical test probe 20 generally consists of a probing head 30, a cable 32, and a testing instrument connector 34. The probing head 30 may have an integral or replaceable probe tip 40 that is suitable for making an electrical contact with electrical components 22. The testing instrument connector 34 is suitable for connecting to a testing instrument 24. If the probe tip 40 is replaceable, generally the probing head 30 will have a socket 38 or other connection mechanism for mating with the probe tip 40. The probing head 30 is attached to a first end of the cable 32 and the testing instrument connector 34 is attached to the opposite end of the cable 32.

As current flows through wires and electrical components, it generates electromagnetic fields. Some of the energy radiates around the wires and electrical components. At certain frequencies, the fields can reflect and bounce back into the wires and electrical components. This process tends to create a varying response with respect to frequency that is undesirable. Ideal test probes have a perfect curve frequency response (shown as a flat line on a frequency response graph) in which voltage in is equal to (or proportional to) voltage out.

FIG. 2 shows a frequency response graph of the exemplary 7.5 GHz bandwidth probe shown in FIG. 3. This exemplary probe has adjustable dual tip technology that allows the user to set the spacing of the probe tips in a continuously variable fashion. Within its housing 48, the probe head 30 in FIG. 3 includes a crisscross spring with a "U"-shape over molded on the free ends of the spring 50(a), 50(b). The probe head 30 has an elongated cast shell 52 that houses the bulk of a hybrid 54 with a custom amplifier. The 50-Ohm transmission line input 56a, 56b, 56c comes out of the elongated housing, arches up, splits at a 90 degree angle and bends into the "U"-shaped channels where they are fixed or glued. A thin 0.02 inch FR4 backer 58 backs the flex. As the backer 58 emerges from the "U," a resistor 60 is in series with the transmission line 62 and tip 40. A small notch 64 on the FR4 backer 58 accommodates a grounding tether 66. The grounding tether 66 may be soldered or otherwise attached between the series resistor 60 and the 50-Ohm transmission line 56a, 56b, 56c. The 7.5 GHz bandwidth rating is typical for the probe as a stand-alone device. As an ideal frequency response is flat, the large increase in signal amplitude at high frequencies (peaking) shown in FIG. 2 would be understood as undesirable in a frequency response.

Much of the undesired variation in frequency response is due to the fact that some electromagnetic energy radiates into space from the probe tips. This energy can couple back onto the probe circuitry after the attenuating resistor, increasing or decreasing the signal level depending on the phase of the radiated path.

It has long been known that ferrite material (e.g. ferrite caps) can be used to dissipate, absorb, and/or dampen magnetic fields. In the exemplary probe head 30 of FIG. 3, ferrite material is shown as 68. Ferrite materials attempt to resolve problems associated with magnetic fields. When placed near metal conductors, these materials can attenuate the magnetic fields created by high frequency current flow, and thus reduce radiated fields. One problem with the ferrite materials is that they do not solve the problems associated with electrical fields. Another problem with the ferrite materials is that since they are placed near conductors to dampen the magnetic fields, they can also change the electrical characteristics of the conductors. For example, placing a ferrite bead around a probe tip will increase the tip inductance at the same time as reducing the radiated field. Test probes with ferrite materials do not have perfect frequency responses.

Other material such as conductive foam (e.g. foam with slightly conductive properties) and conductive films have also been used for solving problems with electromagnetic fields. None of these products have provided satisfactory results.

BRIEF SUMMARY OF THE INVENTION

It is desirable to have a material that would dissipate, absorb, or dampen electric fields so that such material could be placed and secured in positions where the electric field is stronger, and reduce undesired signals.

The present invention is directed to a lossy dielectric device for use with a transmission path, such as a transmission line or resistor in a probe head. The lossy dielectric device preferably includes a lossy dielectric material contained within a container. The container is positionable and securable substantially adjacent to said transmission path to improve the curve of a frequency response. Preferably, the container is insulative, puncture resistant, and thin. In some preferred embodiments, a temporary or permanent connection mechanism is also included.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
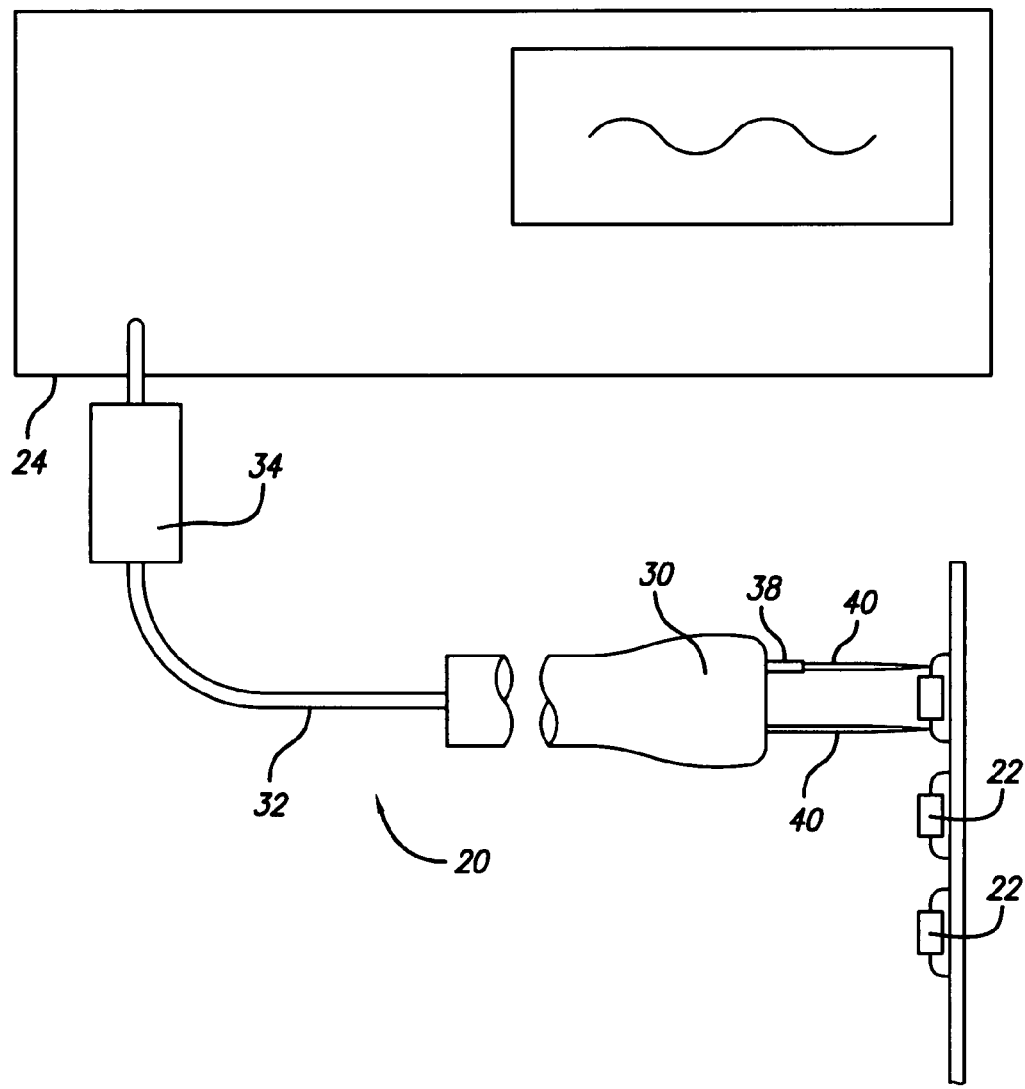
FIG. 1 is a schematic diagram of an exemplary probing system in which the present invention may be used.

As shown in FIG. 1, the present invention may be implemented as part of a probing system that includes an electrical test probe 20 for providing an electrical connection between electrical components 22 and testing instruments 24. An electrical test probe 20 generally consists of a probing head 30, a cable 32, and a testing instrument connector 34. The probing head 30 may have an integral or replaceable probe tip 40 that is suitable for making an electrical contact with electrical components 22. The testing instrument connector 34 is suitable for connecting to a testing instrument 24. If the probe tip 40 is replaceable, generally the probing head 30 will have a socket 38 or other connection mechanism for mating with the probe tip 40. The probing head 30 is attached to a first end of the cable 32 and the testing instrument connector 34 is attached to the opposite end of the cable 32.

Figure 2:
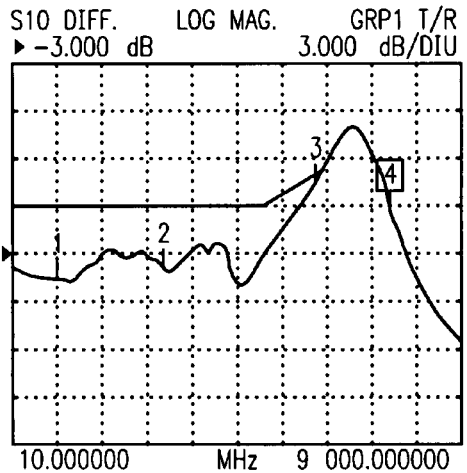
FIG. 2 is a frequency response graph of an exemplary test probe.
Figure 3:
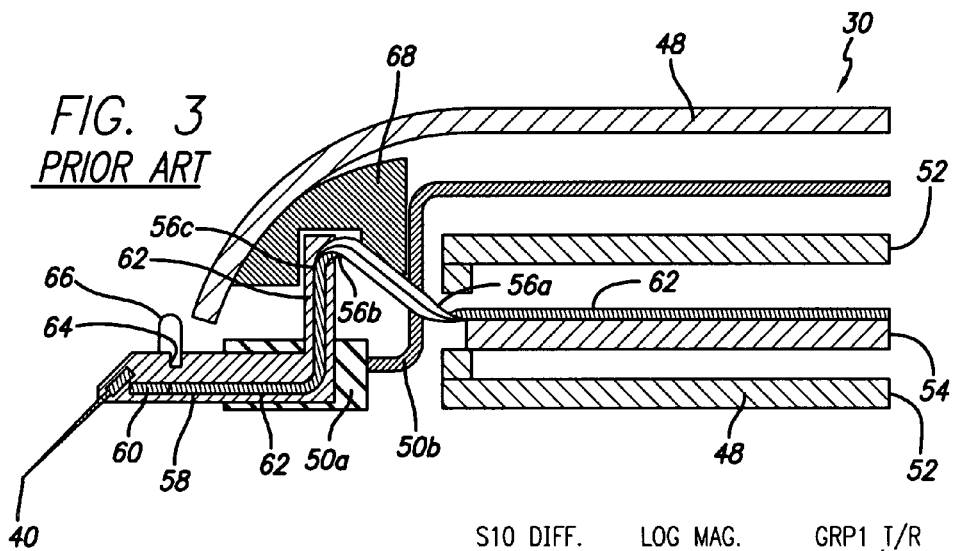
FIG. 3 is a cross-sectional side view of an exemplary prior art test probe having ferrite material.
Figure 4:
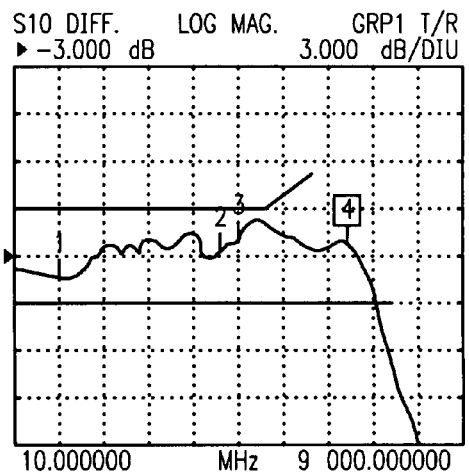
FIG. 4 is a frequency response graph of an exemplary test probe with a user's finger held over the resistors.

FIG. 3 shows an exemplary prior art probing head 30. As set forth in the background, the probe head 30 includes a resistor 60 in series with a transmission line 62 and tip 40. The inventor of the present invention realized that by placing a finger over the resistors 60, she was able to improve the frequency curve as shown in FIG. 4. As an ideal frequency response is flat, the reduced peaking shown in FIG. 4 would be understood as a more desirable frequency response than the frequency response of the probing head 30 (FIG. 2). The problem is that it would be impossible for a user to hold a finger over the resistors 60 permanently.

The present invention contemplates the use of a lossy dielectric cap device 100 at or near the resistors 60 and/or transmission line 62 of a probing head 30. The lossy dielectric cap 100 is preferably made from materials having a finite conductivity in which the electromagnetic fields can propagate, but lose energy. The conductivity should not be so low that the material functions as an insulator through which the electromagnetic fields would propagate with no attenuation. The conductivity should not be so high that the material functions as a good conductor from which the electromagnetic fields would be reflected back. In one preferred embodiment the lossy dielectric cap device 100 approximates the composition of a human finger.

FIGS. 5-11 show exemplary embodiments of a lossy dielectric cap 100 of the present invention. FIGS. 12-18 show exemplary placements of a lossy dielectric cap 100 of the present invention. These figures will be discussed in more detail below.

Exemplary Embodiments of the Lossy Dielectric Cap

As shown in FIGS. 5-10, the lossy dielectric cap 100a-e (discussed generally as 100) of the present invention preferably includes a container 102a-e (discussed generally as 102) and dielectric material 104a-e (discussed generally as 104) contained within the container. The container is shaped and/or has connection mechanisms 106a-e (discussed generally as 106) such that the lossy dielectric cap 100 is positionable and securable substantially adjacent to at least one resistor 60 and/or the transmission line 62 (which may jointly be referred to as a transmission path) of a probing head 30. When correctly positioned the lossy dielectric cap 100 improves the curve of a frequency response of a test probe.

For most of the exemplary embodiments discussed herein, the lossy dielectric cap 100 includes a container 102 and dielectric material 104 (e.g. a dipole). It should be noted, however, that alternative embodiments could include any material that has a finite conductivity such that the electromagnetic field energy is dissipated.

The container 102 may be made or constructed of materials including, but not limited to, plastic, rubber, polymeric material, biologically compatible elastically deformable material, that is preferably insulative, puncture resistant, and thin. The container 100 may be all or partially flexible, may be semi-rigid or contain a semi-rigid component, or may be all or partially rigid (if properly formed).

The dielectric material 102 may be made or constructed of materials including, but not limited to, a saline solution, a polysiloxane or a silicone gel, bio-osmotic gel (e.g. the combination of a bio-compatible organic polymer and a solution of bio-compatible salt disclosed in U.S. Pat. No. 5,067,965 to Ersek, which is incorporated herein by reference), or any lossy dielectric material. The dielectric material 102 would most likely be an organic material. One exemplary dielectric material 102 would be a mixture that includes the following ingredients: buffered, isotonic liquid solution of a borate buffer system and sodium chloride, sorbic acid, and edentate disodium.

It should be noted that the connection mechanism 106 for connecting the lossy dielectric cap 100 to a probe may be integral with the probe. Alternatively, connection mechanism 106 for connecting the lossy dielectric cap 100 may be temporarily or permanently attachable to and/or removable from the probe. As an example of an integral connection mechanism 106, the housing 48 of a probe may include an integral compartment that functions as a container 102. An adhesive may be used as a temporary connection mechanism 106 or as a permanent connection mechanism 106. For example, if a temporary, semi-permanent, or removable adhesive (e.g. 3M #486 adhesive) is used as the connection mechanism 106 then the lossy dielectric cap 100 may be placed/secured in position and, if desired, removed later. Such an adhesive would allow a user to remove, replace, and/or reposition the lossy dielectric cap 100. This characteristic would make the lossy dielectric cap 100 removably interconnectable. Preferably, the temporary connection mechanism would not leave a residue when it is removed. If a permanent adhesive (e.g. epoxy or acrylate adhesive) is used as the connection mechanism 106, then the lossy dielectric cap 100, once placed, could not be removed. Mechanical mechanisms may also be used either as a temporary connection mechanism 106 or as a permanent connection mechanism 106.

FIGS. 5-11 show exemplary embodiments of the lossy dielectric cap 100. These embodiments are meant to be exemplary and are not meant to limit the scope of the present invention.

Figure 5:
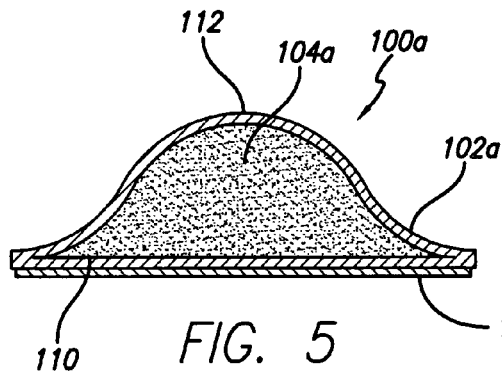
FIG. 5 is a cross-sectional side view of a first exemplary lossy dielectric cap of the present invention in which the container has a semi-rigid bottom surface and a soft upper surface.
Figure 6:
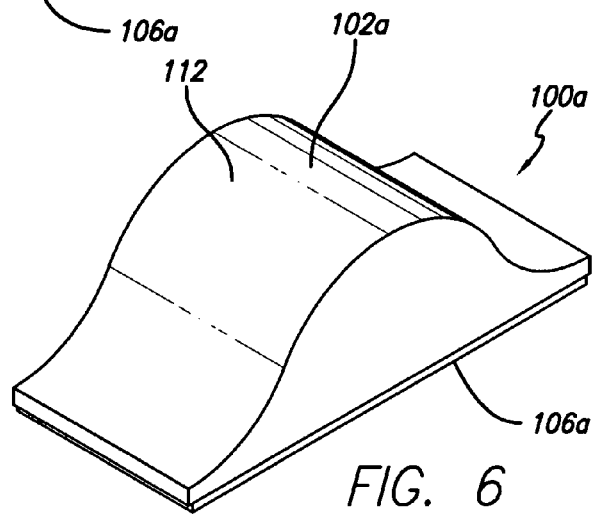
FIG. 6 is a perspective view of the first exemplary lossy dielectric cap shown in FIG. 5.

FIGS. 5 and 6 show a first exemplary lossy dielectric cap 100a of the present invention. This embodiment includes a container 102a and dielectric material 104a contained within the container 102a. The container 102a has a semi-rigid bottom surface 110 and a soft, formable, flexible, and/or "squishy" upper surface 112. The connection mechanism 106a is adhesive (temporary or permanent) that can secure the lossy dielectric cap 100a substantially adjacent the at least one resistor 60 and/or transmission line 62 of a probing head 30.

Figure 7:
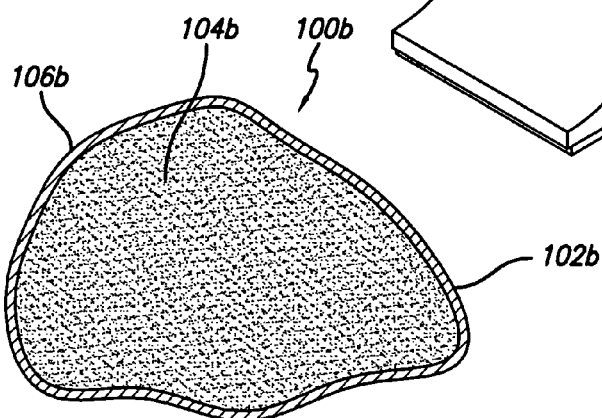
FIG. 7 is a cross-sectional side view of a second exemplary lossy dielectric cap of the present invention in which the container is completely soft.

FIG. 7 shows a second exemplary embodiment of the lossy dielectric cap 100b of the present invention. This embodiment preferably includes a container 102b and dielectric material 104b contained within the container 102b. In this embodiment, the container 102b is completely soft, formable, flexible, and/or "squishy." Because of the consistency of the container 102b, the lossy dielectric cap 100b of this embodiment can be wedged into a tight space and held in position. Accordingly, the container 102b itself is the connection mechanism 106b that holds the lossy dielectric cap 100b substantially adjacent the at least one resistor 60 and/or transmission line 62 of a probing head 30.

Figure 8:
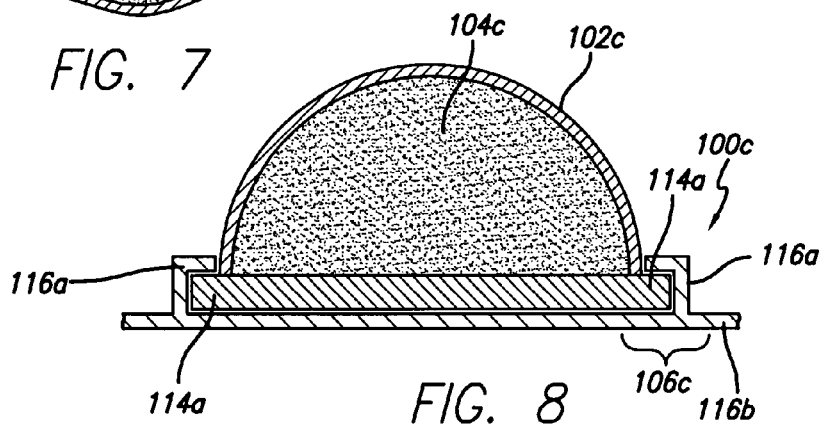
FIG. 8 is a cross-sectional side view of a third exemplary lossy dielectric cap of the present invention in which the container has an integral or added bottom surface.

FIG. 8 shows a third exemplary lossy dielectric cap 100c of the present invention. This embodiment includes a container 102c and dielectric material 104c contained within the container 102c. The container 102c has an integral or added bottom surface 114a that extends on both sides beyond the main compartment of the container 102c. In this embodiment the edges of the bottom surface 114a may mate with probe structure 116a (shown as a pair of jaws or rails that hold the bottom surface 114a edges) to jointly function as the connection mechanism 106c to secure the lossy dielectnc cap 100c substantially adjacent the at least one resistor 60 and/or transmission line 62 of a probing head 30. One advantage of this embodiment is that the bottom surface 114a may be made of a ferrite material (a layer of ferrite material) that can be used to dissipate. absorb, and/or dampen magnetic fields.

Figure 9:
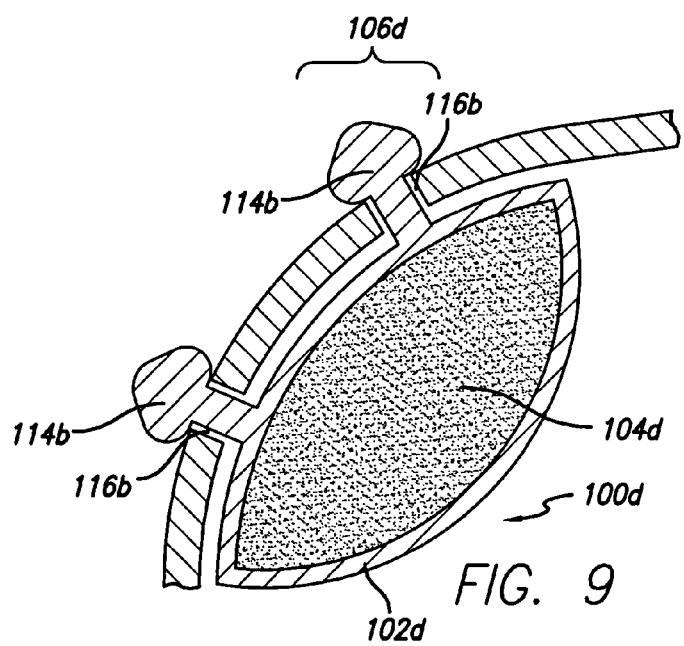
FIG. 9 is a cross-sectional side view of a fourth exemplary lossy dielectric cap of the present invention in which the container has an integral or attached bottom surface with at least one protrusion for mating with probe structure.

FIG. 9 shows a fourth exemplary lossy dielectric cap 100d of the present invention. This embodiment includes a container 102d and dielectric material 104d contained within the container 102d. The container 102d has an integral or added bottom surface with at least one protrusion 114b. In this embodiment the protrusions 114b may mate with probe structure 116b (shown as apertures through which the protrusions 114b may be inserted) to jointly function as the connection mechanism 106d to secure the lossy dielectric cap 100d substantially adjacent the at least one resistor 60 and/or transmission line 62 of a probing head 30. One advantage of this embodiment is that it may be suspended "upside-down" on top of the resistors 60 and/or transmission line 62.

Figure 10:
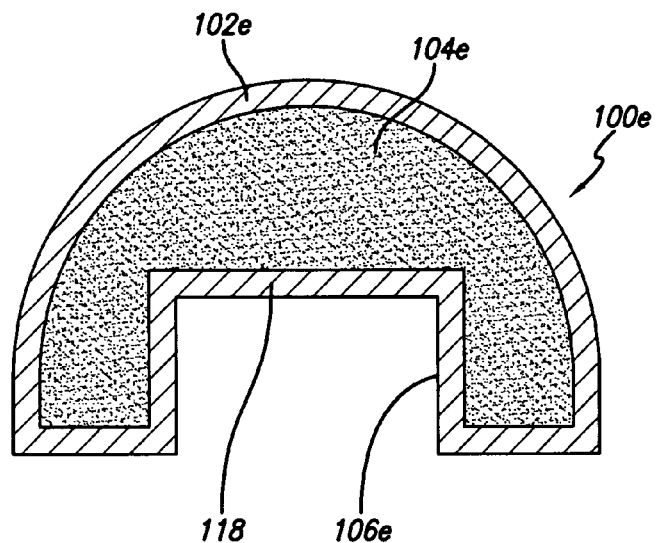
FIG. 10 is a cross-sectional side view of a fifth exemplary lossy dielectric cap of the present invention in which the container has a formed bottom surface that may be used to mate with components of the probing head.

FIG. 10 shows a fifth exemplary lossy dielectric cap 100e of the present invention. This embodiment includes a container 102e and dielectric material 104contained within the container 102e. The container 102e has a formed bottom surface 118 that may be used to mate with components of the probing head 30.

Figure 11:
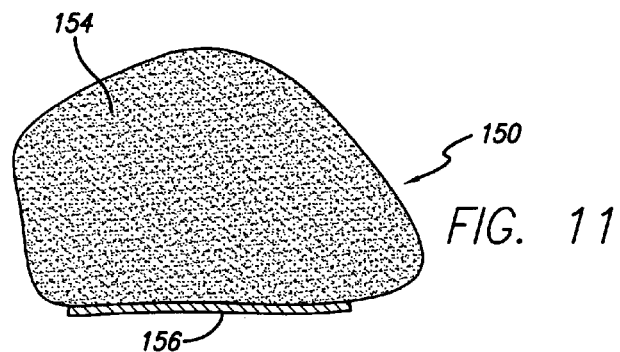
FIG. 11 is a cross-sectional side view of a sixth exemplary lossy dielectric cap of the present invention.

As shown in FIG. 11, an alternative lossy dielectric cap 150 uses a "solid" dielectric material 154. The dielectric material 154 may be foam, gel, clay, or other material that is soft, "squishy," or formable. This embodiment eliminates the need for a container. The dielectric material 154 is shaped and/or has connection mechanisms 156 such that the lossy dielectric cap 150 is positionable substantially adjacent the at least one resistor 60 and/or transmission line 62 of a probing head 30. When correctly positioned, the lossy dielectric cap 150 improves the curve of a frequency response of a test probe.

Exemplary Placements of the Lossy Dielectric Cap

As set forth above, FIGS. 12-18 show exemplary placements of a lossy dielectric cap of the present invention. Ideally, the lossy dielectric cap is placed within approximately 0.10 inches (substantially adjacent) of the resistor(s) 60, the transmission line 62, or any other elements of the transmission path of the probe. These placements, however, are meant to be exemplary and are not meant to limit the scope of the invention.

Figure 12:
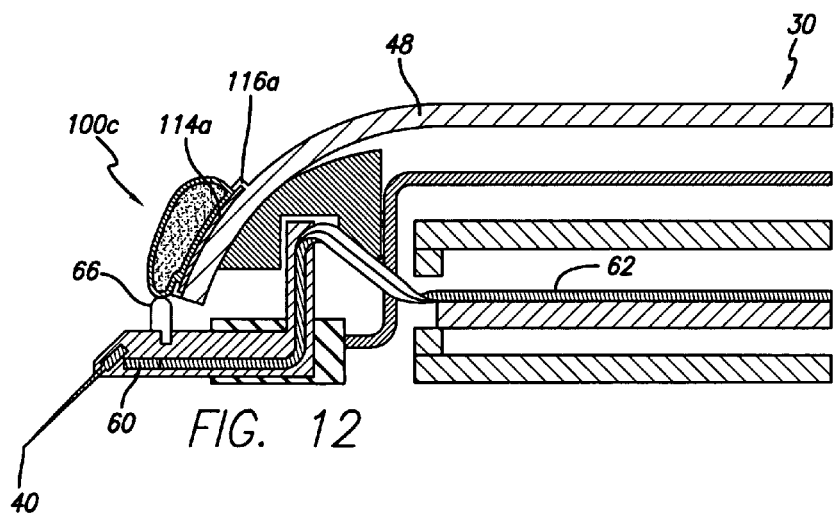
FIG. 12 is a cross-sectional side view of an exemplary test probe with an exemplary lossy dielectric cap positioned on the front of the probing head housing behind the tip and resistors.
Figure 19:
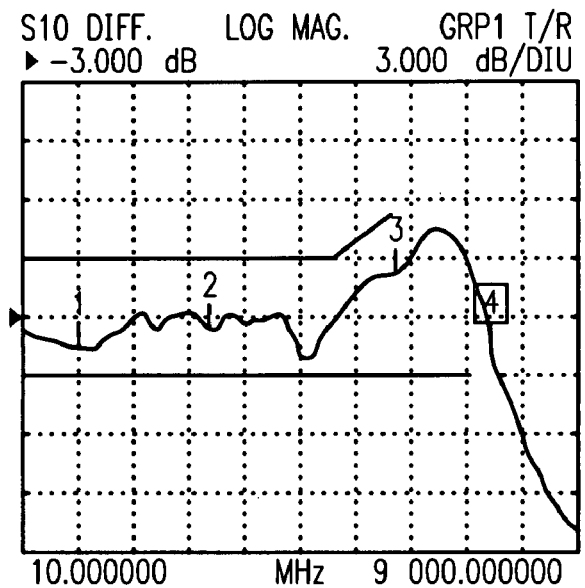
FIG. 19 is a frequency response graph of the exemplary test probe of FIGS. 12 and 13.

As shown in FIG. 12, in a preferred embodiment, a lossy dielectric cap 100 may be positioned and secured on the front of the probing head 30, housing 48 behind the tip 40, resistors 60, and/or transmission line 62. In the shown embodiment, the dielectric cap 100 is positioned behind the ground wire 66. In the embodiment shown in FIG. 12, the dielectric cap 100c (FIG. 8) is used. As can be seen from FIG. 19, this placement of the lossy dielectric cap has a frequency response that is a significant improvement over the frequency response (FIG. 2) of an exemplary test probe and that roughly approximates the frequency response (FIG. 4) of an exemplary test probe with a user's finger held over the resistors 60.

Figure 13:
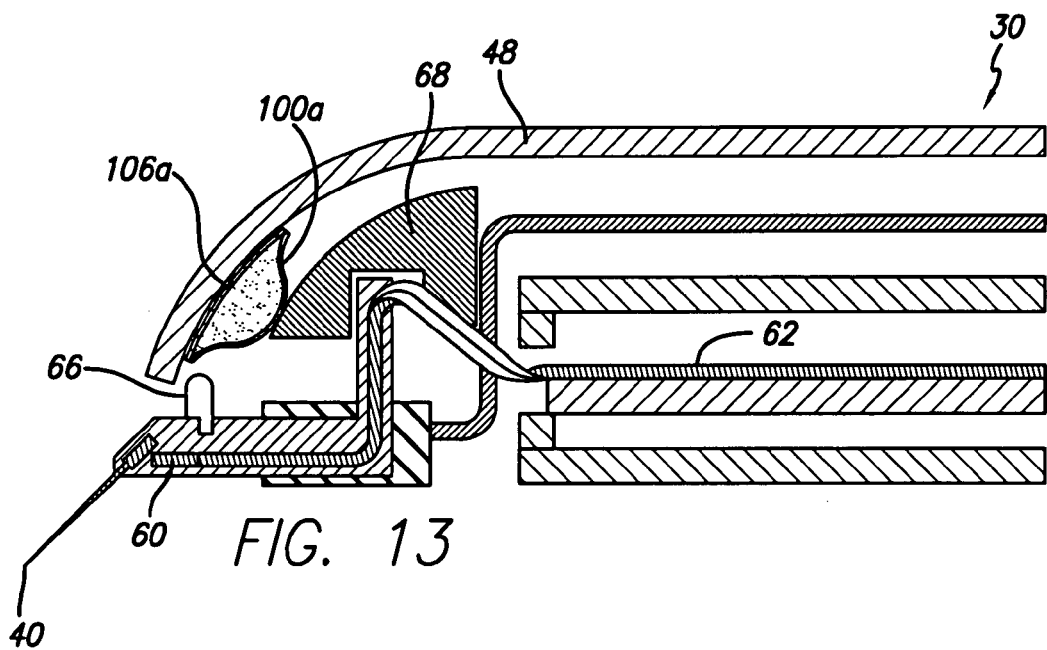
FIG. 13 is a cross-sectional side view of an exemplary test probe with an exemplary lossy dielectric cap positioned inside of the probing head housing.

As shown in FIG. 13, in a preferred embodiment, a lossy dielectric cap 100 may be positioned and secured inside of the probing head 30 housing 48 behind the tip 40 and resistors 60 and/or transmission line 62. In the shown embodiment, the dielectric cap 100 is positioned behind the ground wire 66. In this embodiment the dielectric cap 100a (FIGS. 5 and 6) is used.

Figure 14:
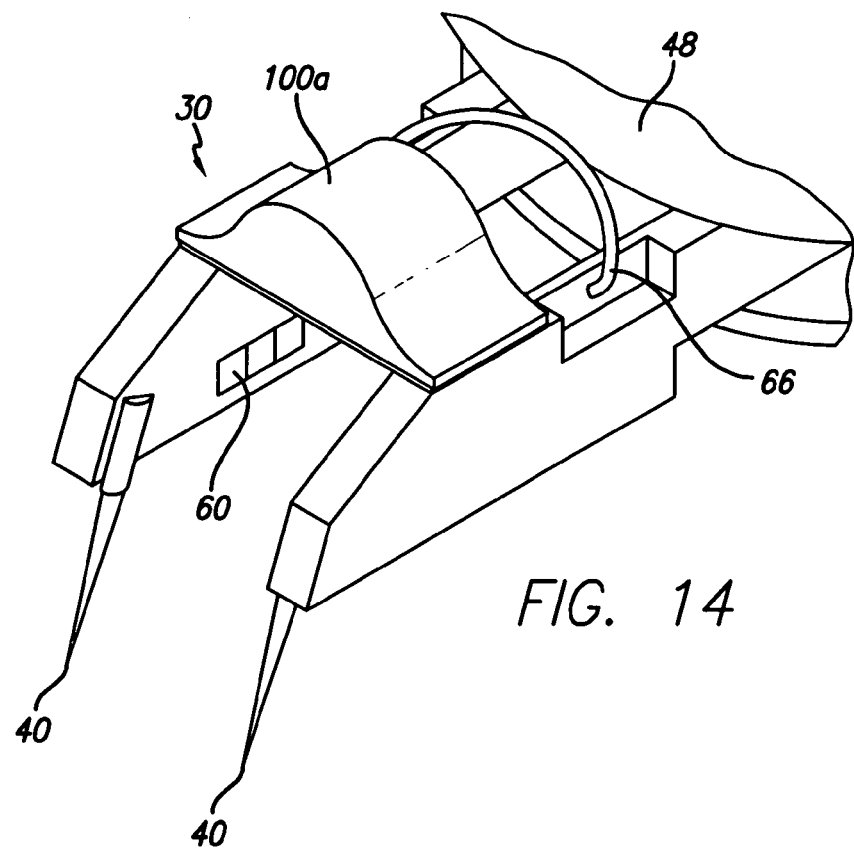
FIG. 14 is a perspective view of an exemplary test probe with an exemplary lossy dielectric cap positioned on the front of the probing head housing behind the tip and resistors.

As shown in FIG. 14, in a preferred embodiment a lossy dielectric cap 100 may be positioned and secured in front of the ground wire 66.

Figure 15:
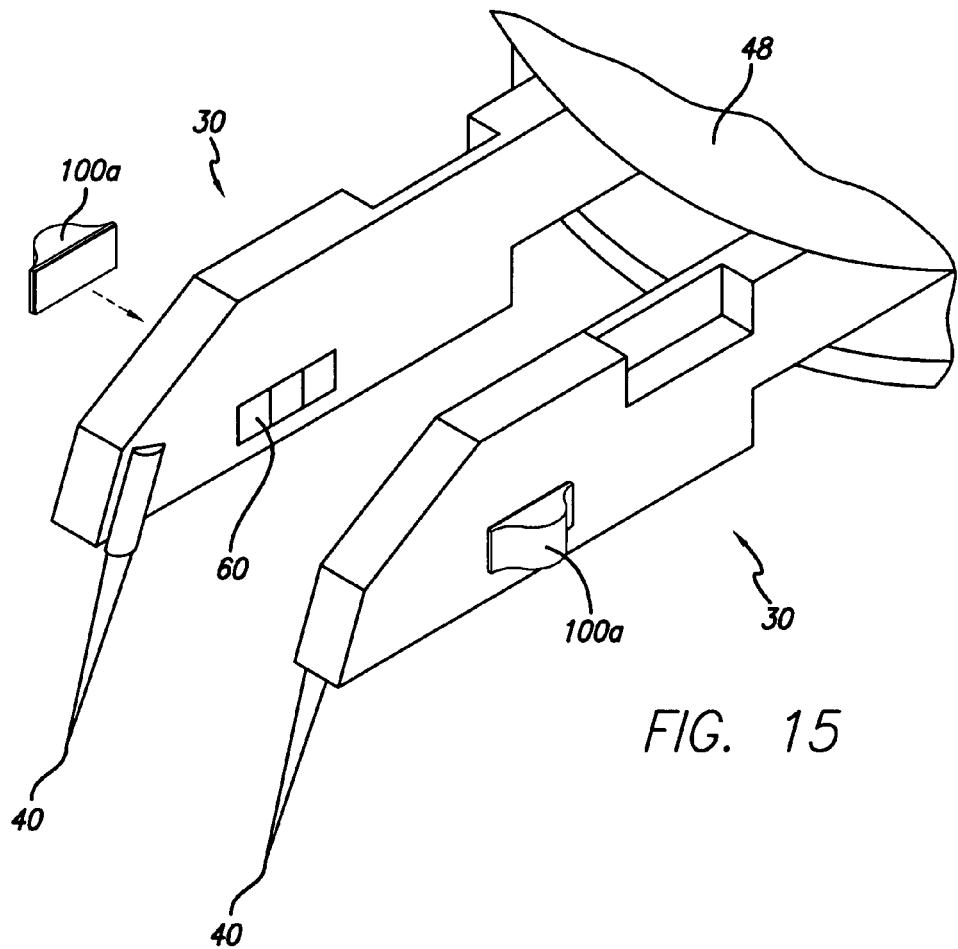
FIG. 15 is a perspective view of an exemplary test probe with an exemplary lossy dielectric cap positioned behind the tip PCA opposite the resistors.
Figure 20:
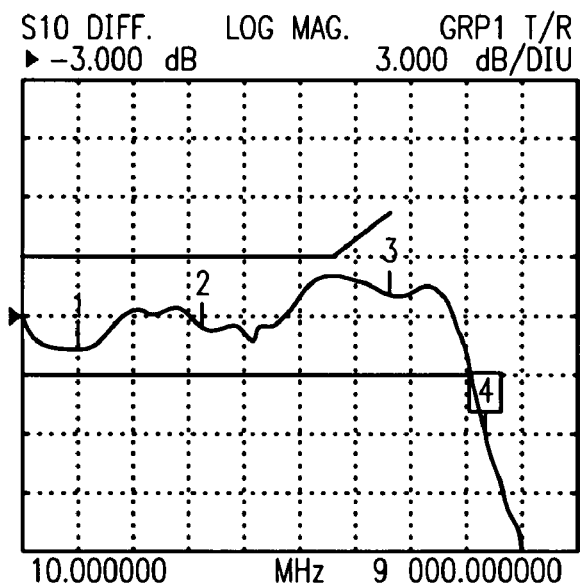
FIG. 20 is a frequency response graph of the exemplary test probe of FIG. 15.

As shown in FIG. 15, in a preferred embodiment a lossy dielectric cap 100 may be positioned and secured behind the tip PCA opposite the resistors 60. This positioning may also be described as being positioned on the "back side" of the support PCA opposite the resistor 60. In this exemplary embodiment the dielectric cap 100a (FIGS. 5 and 6) is used. As can be seen from FIG. 20, this placement of the lossy dielectric cap has a frequency response that is a significant improvement over the frequency response (FIG. 2) of an exemplary test probe and that roughly approximates the frequency response (FIG. 4) of an exemplary test probe with a user's finger held over the resistors 60.

Figure 16:
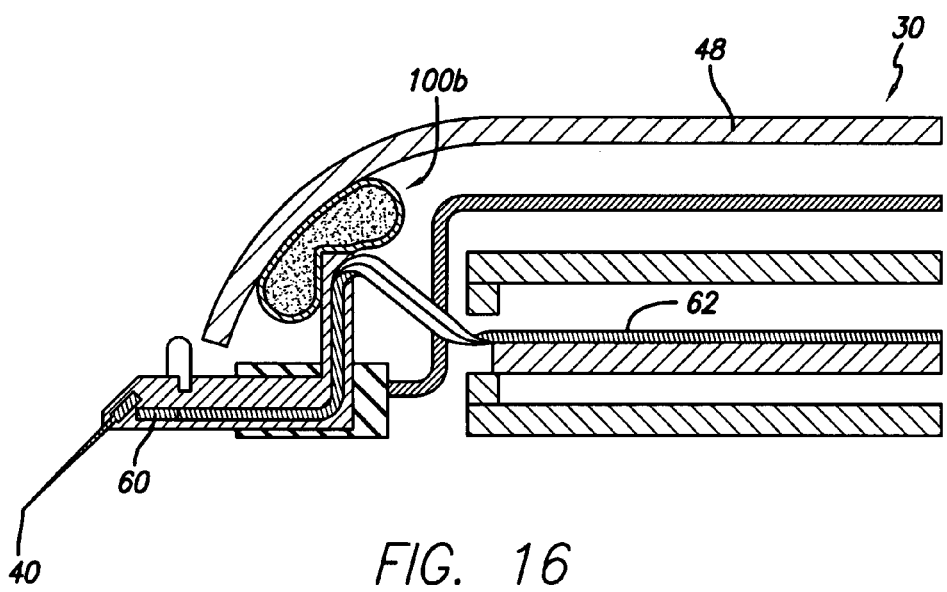
FIG. 16 is a cross-sectional side view of an exemplary test probe with an exemplary lossy dielectric cap positioned along the transmission path inside the probing head housing.
Figure 17:
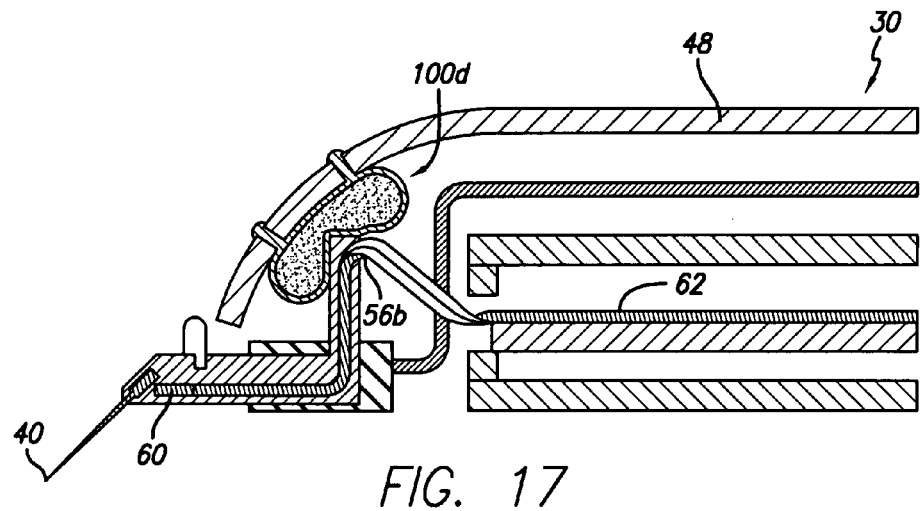
FIG. 17 is a cross-sectional side view of an exemplary test probe with an exemplary lossy dielectric cap positioned along the transmission path inside the probing head housing.
Figure 18:
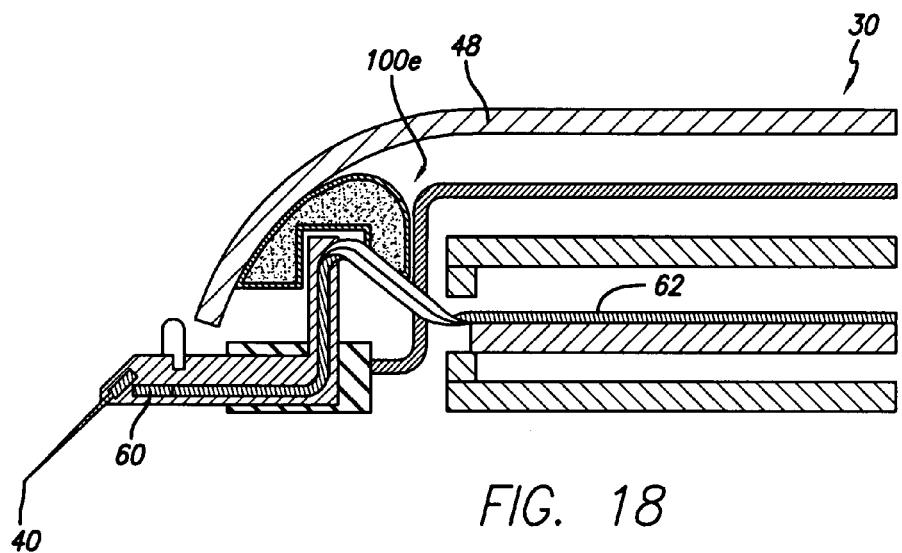
FIG. 18 is a cross-sectional side view of an exemplary test probe with an exemplary lossy dielectric cap positioned along the transmission path inside the probing head housing.

As shown in FIGS. 16-18, in a preferred embodiment, a lossy dielectric cap 100 may replace the ferrite material 68 (such as that shown in FIG. 3) with an alternative lossy dielectric cap 100. In the exemplary embodiment of FIG. 16, the dielectric cap 100b of FIG. 7 is used. In the exemplary embodiment of FIG. 17, the dielectric cap 100d of FIG. 9 is used. In the exemplary embodiment of FIG. 18, the dielectric cap 100e of FIG. 10 is used. By increasing the size and/or positioning of the dielectric cap 100, these embodiments could be positioned along almost any point of a transmission path.

It should be noted that the specific embodiments of the lossy dielectric caps shown in the various placements set forth above are meant to be exemplary. Alternative lossy dielectric caps could be positioned in each of the various positions.

It should be noted that the present invention was described in terms of and in relation to the shown exemplary test probe. It should be noted that the present invention is not limited to this test probe. Alternative probes could have a single test probe tip. Alternative probes could have alternative bandwidths. Alternative test probes might not incorporate an amplifier near the probe tips.

It should be noted that the lossy dielectric cap of the present invention may be used with transmission paths that are not in a test probe. For example, alternate transmission paths may be on a circuit board, a hybrid circuit, or in any electric device where radiated electromagnetic fields may be problematic.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A lossy dielectric device for use with a transmission path, said device comprising:
   (a) a container;
   (b) lossy dielectric material contained within said container; and
   (c) said container positionable substantially adjacent said transmission path to improve the curve of a frequency response.

2. The lossy dielectric device of claim 1 wherein said container is insulative, puncture resistant, and thin.

3. The lossy dielectric device of claim 1 wherein said container is made of a material selected from the group consisting of:
   (a) plastic;
   (b) rubber;
   (c) polymeric material; and
   (d) biologically compatible elastically deformable material.

4. The lossy dielectric device of claim 1 wherein said container has a structure selected from the group consisting of:
   (a) an at least partially flexible structure;
   (b) a completely flexible structure; and
   (c) a structure with a semi-rigid bottom side and a flexible upper side.

5. The lossy dielectric device of claim 1 wherein said lossy dielectric material is selected from a group consisting of:
   (a) a mixture of salt and water;
   (b) saline solution;
   (c) a polysiloxane or a silicone gel; and
   (d) bio-osmotic gel.

6. The lossy dielectric device of claim 1 further comprising at least one connection mechanism selected from the group consisting of:
   (a) at least one permanent connection mechanism; and
   (b) at least one temporary connection mechanism.

7. The lossy dielectric device of claim 1 further comprising a layer of ferrite material.

8. The lossy dielectric device of claim 1, wherein said lossy dielectric material is a lossy dielectric fluid, a "squishy" material, or a formable material enclosed in said container.

9. A probing head comprising:
   (a) a transmission path;
   (b) a container;
   (c) lossy dielectric material contained within said container; and
   (d) said container securable substantially adjacent said transmission path to improve the curve of a frequency response.

10. The probing head of claim 9 wherein said container is insulative, puncture resistant, and thin.

11. The probing head of claim 9 wherein said container is made of a material selected from the group consisting of:
    (a) plastic;
    (b) rubber;
    (c) polymeric material; and
    (d) biologically compatible elastically deformable material.

12. The probing head of claim 9 wherein said container has a structure selected from the group consisting of:
    (a) an at least partially flexible structure;
    (b) a completely flexible structure; and
    (c) a structure with a semi-rigid bottom side and a flexible upper side.

13. The probing head of claim 9 wherein said lossy dielectric material is selected from a group consisting of:
    (a) a mixture of salt and water;
    (b) saline solution;
    (c) a polysiloxane or a silicone gel; and
    (d) bio-osmotic gel.

14. The probing head of claim 9 further comprising at least one connection mechanism selected from the group consisting of:
    (a) at least one permanent connection mechanism; and
    (b) at least one temporary connection mechanism.

15. The probing head of claim 9 further comprising a layer of ferrite material.

16. The probing head of claim 9, wherein said lossy dielectric material is a lossy dielectric fluid, a "squishy" material, or a formable material enclosed in said container.

17. A frequency response improving system, said system comprising:
    (a) a probing head;
    (b) a transmission path associated with said probing head;
    (c) a container;
    (d) lossy dielectric material contained within said container; and
    (e) said container positionable and securable substantially adjacent at least part of said transmission path to improve the curve of a frequency response.

18. The system of claim 17 wherein said container has a structure selected from the group consisting of:
    (a) an at least partially flexible structure;
    (b) a completely flexible structure; and
    (c) a structure with a semi-rigid bottom side and a flexible upper side.

19. The system of claim 17, wherein said lossy dielectric material is a lossy dielectric fluid, a "squishy" material, or a formable material enclosed in said container.

20. A frequency response improving system for use with a probing head having a transmission path, said system comprising:
- (a) a container;
- (b) lossy dielectric material contained within said container; and
- (c) said container positionable and securable substantially adjacent at least part of said transmission path to improve the curve of a frequency response.

21. The probing head of claim 20 wherein said container has a structure selected from the group consisting of:
- (a) an at least partially flexible structure;
- (b) a completely flexible structure; and
- (c) a structure with a semi-rigid bottom side and a flexible upper side.

22. The system of claim 20, wherein said lossy dielectric material is a lossy dielectric fluid, a "squishy" material, or a formable material enclosed in said container.

* * * * *